United States Patent
Zhao et al.

(10) Patent No.: US 6,210,485 B1
(45) Date of Patent: Apr. 3, 2001

(54) CHEMICAL VAPOR DEPOSITION VAPORIZER

(75) Inventors: Jun Zhao, Cupertino; Lee Luo, Fremont; Xiaoliang Jin; Frank Chang, both of San Jose; Charles Dornfest, Fremont; Po Tang, San Jose, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/352,629

(22) Filed: Jul. 13, 1999

Related U.S. Application Data

(60) Provisional application No. 60/093,563, filed on Jul. 21, 1998.

(51) Int. Cl.[7] .............................. C23C 16/00; H05H 1/00; F02M 15/00
(52) U.S. Cl. ..................... 118/724; 118/715; 118/726; 156/345; 261/142; 261/141
(58) Field of Search .................. 118/726, 715, 118/724; 156/345; 261/142, 141

(56) References Cited

U.S. PATENT DOCUMENTS

| | | |
|---|---|---|
| 809,839 | 1/1906 | Payne . |
| 2,490,547 | 12/1949 | Schraner et al. ................ 219/39 |
| 2,920,179 | 1/1960 | Shaw ................ 219/39 |
| 2,925,329 | 2/1960 | Yost ................ 23/281 |
| 3,190,262 | 6/1965 | Baskish et al. ................ 118/48 |
| 3,350,219 | 10/1967 | Shaler ................ 117/107 |
| 4,212,663 | 7/1980 | Aslami ................ 65/144 |
| 4,349,732 | 9/1982 | Whitby et al. ................ 250/201 |
| 4,718,985 | * 1/1988 | Kjellander ................ 202/172 |
| 4,723,967 | 2/1988 | Tom ................ 55/36 |
| 4,738,693 | 4/1988 | Tom ................ 55/36 |
| 4,847,469 | 7/1989 | Hofmann et al. ................ 219/273 |
| 4,954,371 | 9/1990 | Yializis ................ 427/44 |
| 5,110,622 | 5/1992 | Hasegawa et al. ................ 427/126.1 |
| 5,120,703 | 6/1992 | Snyder et al. ................ 505/1 |
| 5,204,314 | 4/1993 | Kirlin et al. ................ 505/1 |
| 5,224,202 | 6/1993 | Arnold et al. ................ 392/399 |
| 5,259,995 | 11/1993 | Metalis ................ 261/107 |

(List continued on next page.)

FOREIGN PATENT DOCUMENTS

| | | |
|---|---|---|
| 0736613A1 | 10/1996 | (EP) . |
| 0738788A2 | 10/1996 | (EP) . |

OTHER PUBLICATIONS

Advanced Technology Materials, Operating Manual, LDS–300B, Liquid Delivery System, Version 5.0, 1–135 pages.

*Primary Examiner*—Gregory Mills
*Assistant Examiner*—Parviz Hassanzadeh
(74) *Attorney, Agent, or Firm*—Thomason, Moser & Patterso

(57) ABSTRACT

The invention relates to an apparatus and process for the vaporization of liquid precursors and deposition of a film on a suitable substrate. Particularly contemplated is an apparatus and process for the vaporization of a metal-oxide film, such as a barium, strontium, titanium oxide (BST) film, for deposition on a silicon wafer to make integrated circuit capacitors useful in high capacity dynamic memory modules. The vaporizer comprises thermally controlled components which are adapted for easy assembly and disassembly. A main vaporizing section provides a large heated surface for flash vaporization. A high conductance blocker is disposed at a lower end of the vaporizer to provide an extended vaporization surface. Optionally, a filter may be employed to capture unvaporized precursor droplets.

56 Claims, 5 Drawing Sheets

U.S. PATENT DOCUMENTS

| | | | |
|---|---|---|---|
| 5,337,651 | 8/1994 | Gardiner et al. | 92/87 |
| 5,362,328 | 11/1994 | Gardiner et al. | 118/726 |
| 5,376,409 | 12/1994 | Kaloyeros et al. | 427/248.1 |
| 5,503,678 * | 4/1996 | Usami | 118/724 |
| 5,536,323 | 7/1996 | Kirlin et al. | 118/726 |
| 5,653,806 | 8/1997 | van Buskirk | 118/715 |
| 5,711,816 | 1/1998 | Kirlin et al. | 118/726 |
| 5,741,363 | 4/1998 | van Buskirk et al. | 118/715 |
| 5,876,503 | 3/1999 | Roeder et al. | 118/715 |
| 6,036,783 * | 3/2000 | Fukunaga et al. | 118/724 |
| 6,039,808 * | 3/2000 | Toyoda et al. | 118/715 |
| B1 5,376,409 | 6/1997 | Kaloyeros et al. | 427/248.1 |

* cited by examiner

CHEMICAL VAPOR DEPOSITION VAPORIZER

CROSS-REFERENCE TO RELATED APPLICATION

This application claims the benefit of U.S. Provisional Application Ser. No. 60/093,563, entitled "Chemical Vapor Deposition Vaporizer," filed on Jul. 21, 1998.

BACKGROUND OF THE INVENTION

1. Field of the Invention

The invention relates to an apparatus and process for the vaporization of liquid precursors and deposition of a film on a suitable substrate. Particularly contemplated is an apparatus and process for the deposition of a metal-oxide film, such as a barium strontium titanate (BST) film, on a silicon wafer to make integrated circuit capacitors useful in high capacity dynamic memory modules.

2. Background of the Related Art

The increasing density of integrated circuits (ICs) is driving the need for materials with high dielectric constants to be used in electrical devices such as capacitors for forming 256 Mbit and 1 Gbit DRAMs. Capacitors containing high-dielectric-constant materials, such as organometallic compounds, usually have much larger capacitance densities than standard $SiO_2$—$Si_3N_4$—$SiO_2$ stack capacitors making them the materials of choice in IC fabrication.

One organometallic compound of increasing interest as a material for use in ultra large scale integrated (ULSI) DRAMs is BST due to its high capacitance. Deposition techniques used in the past to deposit BST include RF magnetron sputtering, laser ablation, sol-gel processing, and chemical vapor deposition (CVD) of metal organic materials.

A liquid source BST CVD process entails atomizing a compound, vaporizing the atomized compound, depositing the vaporized compound on a heated substrate and annealing the deposited film. This process requires control over the liquid precursors and gases from introduction from an ampoule into a liquid delivery system through vaporization and ultimately to the surface of the substrate where it is deposited. The goal is to achieve a repeatable process which deposits a film of uniform thickness under the effects of a controlled temperature and pressure environment. This goal has not been satisfactorily achieved because the precursors are finicky and the deposition equipment requires a complex design.

For example, a series of problems result from the use of vaporizers. One difficulty is the lack of efficiency in vaporizing the liquid precursors. Typically, only a portion of the liquid precursors are vaporized due to low conductance in the vaporizer, thereby inhibiting deposition rates and resulting in processes which are not consistently repeatable. In addition, known vaporizers used in CVD processes incorporate narrow passages which eventually become clogged during use and are not adapted for continuous flow processes which can be stabilized. For example, U.S. Pat. No. 5,204,314 entitled, "Method for Delivering an Involatile Reagent in Vapor Form to a CVD Reactor, discloses a flash vaporizer using a matrix structure. The matrix structure generally comprises a heated screen mesh having restricted openings. After extended usage the matrix structure accumulates build up leading to a reduction in vaporization efficiency of the liquid precursors and negative effects on process repeatability and deposition rate.

Another difficulty is that BST liquid precursors have a narrow range of vaporization between decomposition at higher temperatures and condensation at lower temperatures. Known vaporizers lack temperature controlled surfaces and the ability to maintain liquid precursors at a low temperature prior to injection into the vaporizer. This results in deposition of material in the injection lines and in the vaporizer and premature condensation or unwanted decomposition of the precursors. The deposits adversely affect not only the vaporizer but also upstream components such as positive displacement pumps because the pump can rupture its pressure seals or continue to operate until the pressure relief valves on the pump are tripped. Damage to system components, of course, requires maintenance and repair and over time becomes very expensive and increases the cost of ownership of the equipment. Additionally, the deposits formed in the vaporizer may be carried downstream to corrupt other components and ultimately even be delivered to the substrate surface thereby compromising its quality. Thus, temperature controlled flow paths through the vaporizer are needed.

Still another difficulty encountered in the deposition of BST is that the deposition process is performed at elevated substrate temperatures, preferably in the range of about 400–750° C. and the annealing process is performed at substrate temperatures in the range of about 550°–850° C. These high temperature requirements impose demands on the chambers and its other components used in the deposition process. For example, elastomeric O-rings are typically used to seal the deposition chamber and are not generally made of materials that will resist temperatures in excess of about 100° C. for many fabrication cycles. Seal failure may result in loss of pressure as well as contamination of the process chemistry and the system components, thereby resulting in defective film formation on the wafer. In addition, it is necessary to prevent temperature fluctuations of vaporizer surfaces which result from thermal conduction. Loss of heat due to thermal conduction causes temperature gradients across the surface of the substrate resulting in decreased uniformity in film thickness and also increases the power demands required of the system to maintain the high temperature environment in the chamber.

There is a need, therefor, for a high conductance vaporization apparatus which can efficiently vaporize the precursors, deliver the vaporized precursors to downstream system components while maintaining elevated temperatures, preventing unwanted condensation or decomposition of precursors along the pathway and avoiding temperature gradients. It would be preferable if the system were adapted for rapid cleaning and continuous flow operation.

SUMMARY OF THE INVENTION

In one aspect of the present invention, a vaporizer is provided for vaporizing BST and other materials which require vaporization, especially low volatility precursors which are transported as a liquid to the vaporizer to be converted to vapor phase and which must be transported at elevated temperatures to prevent unwanted condensation on gas flow surfaces. The vaporizer comprises a series of heated temperature controlled components which are configured for rapid removal, cleaning and/or replacement. The vaporizer also preferably includes features that protect seals (e.g., elastomeric O-rings) from the deleterious effects of high temperatures generated during fabrication of electrical devices, such as capacitors useful for ULSI DRAMs.

The invention also provides a vaporizing apparatus having large smooth vapor passageways for high conductance to prevent clogging for consistently mixing and efficiently vaporizing liquid precursor components, and delivering the vaporized material to a deposition chamber with negligible decomposition and condensation of the gas in the vaporizer and gas delivery lines. Preferably, the apparatus increases vaporizing efficiency by providing temperature controlled increased surface area to reduce the likelihood of fouling or clogging typically associated with existing vaporizers.

The present invention is characterized by its use in the manufacture of capacitor films of consistently high quality, with significantly reduced and simplified maintenance, and capability for depositing CVD films at high rates with less particle generation. The net result is a fabrication process with enhanced efficiency and economy.

In another aspect of the present invention, a main body having a main vaporizing section is equipped with detachable heating elements. A blocker is disposed below the main vaporizing section. High conductance channels formed in the blocker act as an extended vaporizing surface. In a first embodiment, the channels are in parallel relation and lead to an outlet coupled to a downstream gas line. In a second embodiment, the blocker comprises a gas compactor at least partially disposed within the main vaporizing section. The gas compactor has upper and lower ports in communication with an inlet and a outlet, respectively. A gas channel is defined between the gas compactor and the main vaporizing section to provide fluid communication between the inlet and outlet via the ports. Optionally, a filter may be disposed at a lower end of the vaporizer.

In still another embodiment of the present invention, a vaporizer comprises separable components selectively coupled. In a first embodiment the vaporizer components are coupled by clamps while in another embodiment the components are coupled by VCR® fittings. In each embodiment the components are easily disassembled for inspection and cleaning.

BRIEF DESCRIPTION OF THE FIGURES

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

The present invention is directed to a vaporizer for use in a chemical vapor deposition (CVD) system. While the subsequent description makes references to BST deposition it is understood that the invention may be used in any processing system requiring the advantages of superior serviceability, uniform film deposition, and enhanced efficiency resulting from temperature controlled surfaces. The vaporizer has particular application for the fabrication of metal-oxide dielectrics useful in making capacitors used in ULSI DRAMs as well as a number of other electrical devices. In general, devices that can be made with the present system are those characterized by having one or more layers of insulating, dielectric, or conducting material deposited on a substrate.

Figure 1:
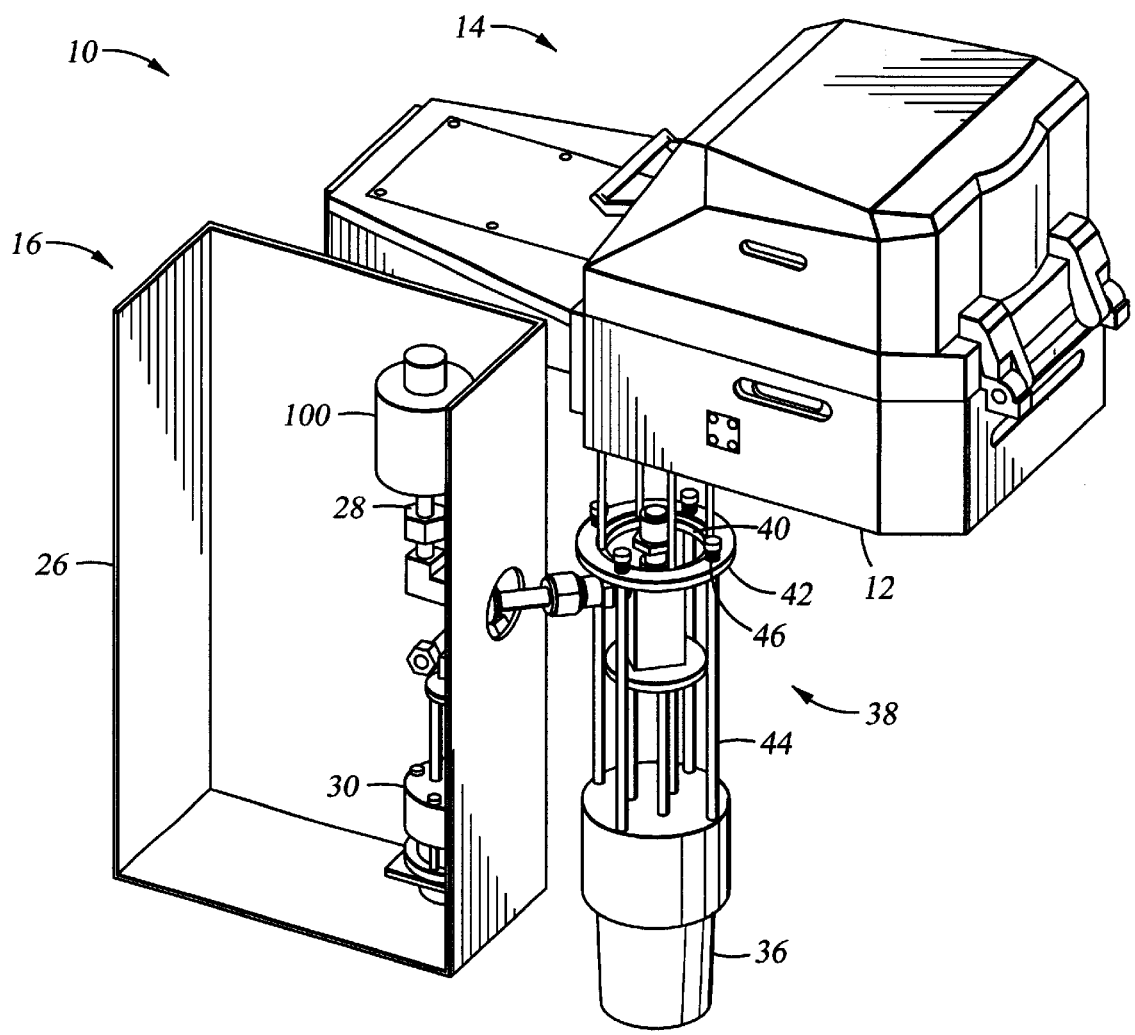
FIG. 1 is a perspective view of a chamber system of the present invention.
Figure 2:
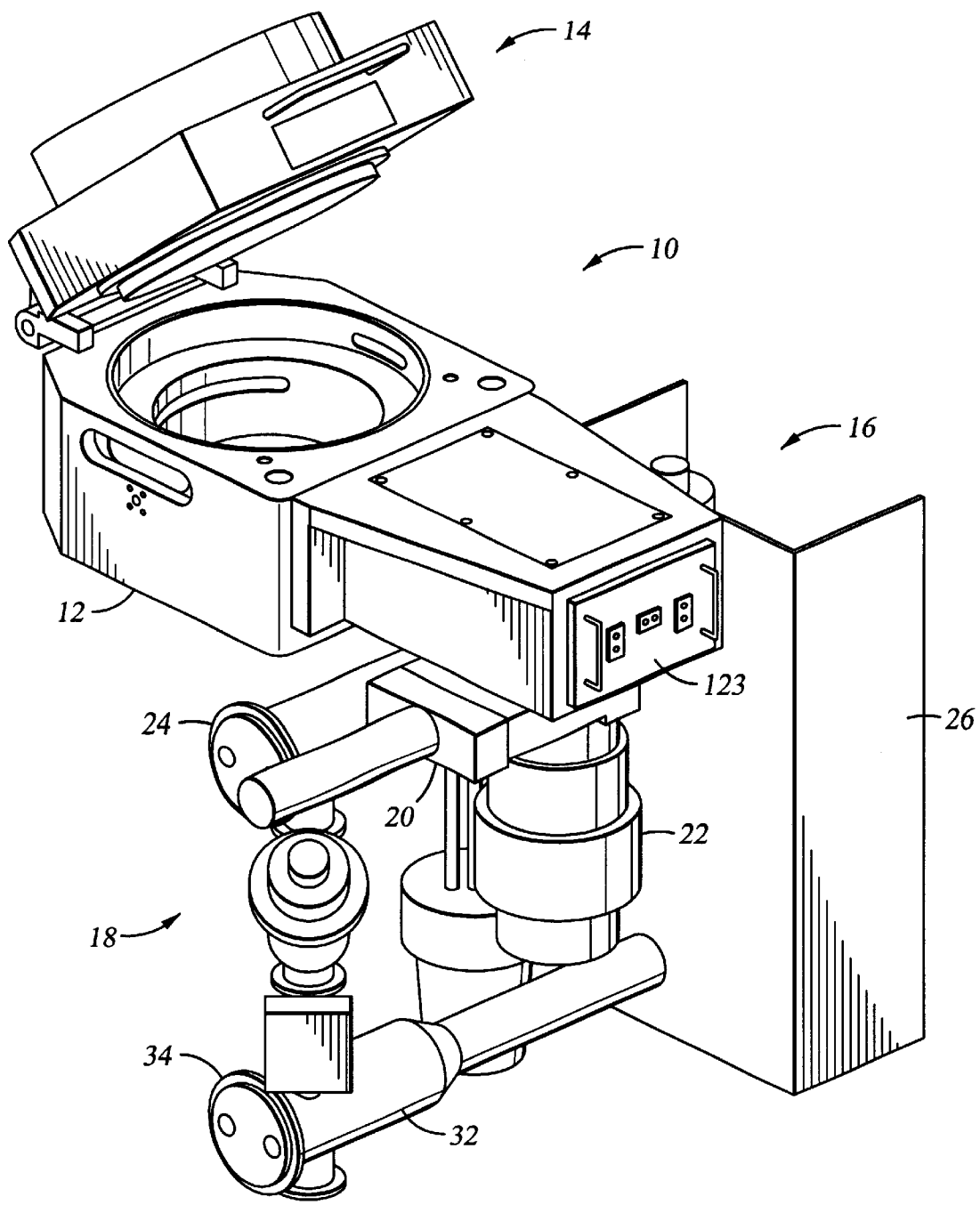
FIG. 2 is a perspective view of a chamber and vaporizer module.

FIGS. 1 and 2 are perspective views of a CVD system 10 incorporating the present invention. The system 10 generally includes a chamber body 12, a heated lid assembly 14, an integrated vaporizer module 16 and an exhaust/pumping system 18 comprising a gate valve 20, a turbo pump 22, and a first cold trap 24. The vaporizing module 16 is shown mounted adjacent to the chamber body 12 in a vaporizer cabinet 26 which includes an outlet line 28 connected to the inlet into the chamber body 12 at one end and a vaporizer 100 at another end. Disposed along the outlet line 28 is a first valve 30 which is connected in turn to a bypass line 32 extending out through the back of the cabinet 26 and is connected to the exhaust/pumping system 18 by a conduit in which a second cold trap 34, located downstream from the valve 30, is disposed. The bypass line 32 is adapted to deliver both vaporized gas as well as liquid solvent into the cold trap 34 in preparation of delivering vaporized gas to the chamber body 12 during processing or during cleaning of the system 10. The first valve 30 controls delivery of the vaporized material to the chamber 12 through the cold trap 34. A second valve 36, such as an isovalve is disposed downstream from the first valve 30 to selectively deliver the vaporized gas into the chamber body 12. The second valve 36 is mounted to the lower portion of the chamber 12 via a rod and washer assembly 38. This assembly 38 enables adjustment of the delivery line as well as the valve 36 in relation to the chamber 12. The mount generally includes first and second rings 40, 42, respectively, one disposed in the other, to allow rotatable adjustment of an isovalve 36 and the outlet line 28. The second valve 36 is mounted to the second ring 42 via a plurality of rods 44 (four shown here) which are mounted from the ring 42 and include a spring 46 disposed above the upper portion of the rod and the ring 42. The two rings 40, 42 enable rotation of the assembly 38 while the spring and rod arrangement allow vertical adjustment of the assembly 38 to ensure proper alignment of the gas feed line 30 into the chamber 12. In general, the suspension assembly 38 provides automatic compensation for thermal expansion/contraction to maintain vacuum seals without the mechanical and thermal stress. The size and dimensions of the system 10 are dictated by the size and shape of the workpiece on which processes of the present invention are performed.

Figure 3:
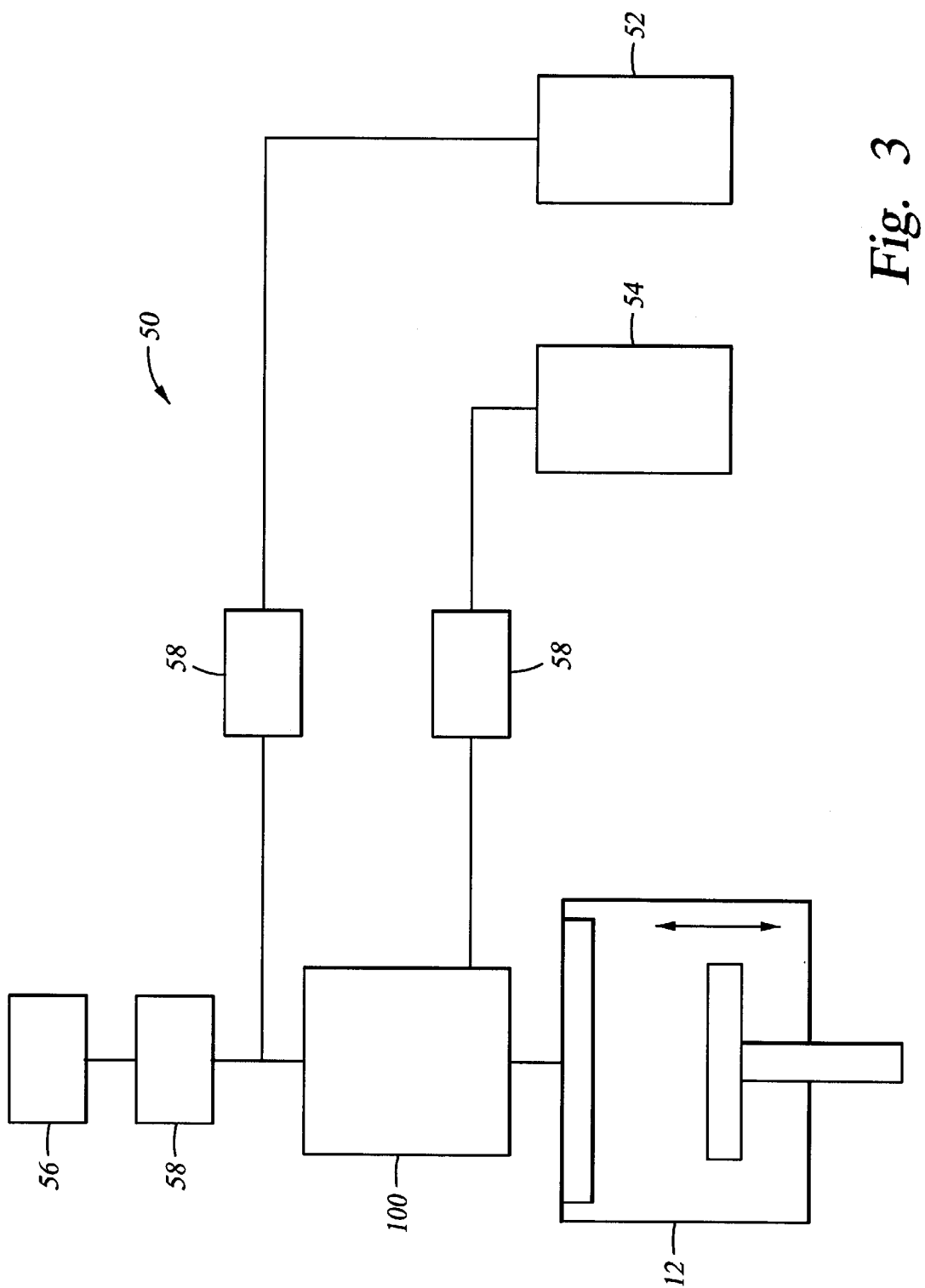
FIG. 3 is a simplified schematic representation of a liquid and gas delivery system.

FIG. 3 shows a simplified liquid and gas delivery system 50 for supplying the liquid precursors and carrier gases to the vaporizer 100. A first gas container 52 and second gas container 54 are connected to the vaporizer 100 to provide carrier gases. The function of these gases is described in detail below. A liquid ampoule 56 is shown connected to the vaporizer 100 to provide liquid precursors. So that the flow rates of the gases and liquids may be monitored and controlled, flow meters 58 are disposed in the liquid and gas delivery lines. The gas delivery lines are preferably made of a material having a low coefficient of friction, such as PTFE, to allow for high flow velocities. Other devices which are commonly known and used in the industry but not shown in FIG. 3 include bubblers, degassers, shut-off valves, etc.

The inventors have recognized that deposition layer uniformity can be enhanced, and maintenance can be reduced, if the vaporizer is substantially maintained at an ideal isothermal system temperature (e.g. 250° C.±5° for BST). The vaporizer 100 incorporates several active and passive thermal control systems including thermal control features which serve to protect a main seal by cooling it below the ideal isothermal system temperature. Cooling is achieved without inducing significant temperature fluctuations and gradients in the vaporizer components exposed to the system chemistry, and without excessive cooling and heating power losses.

Figure 4:
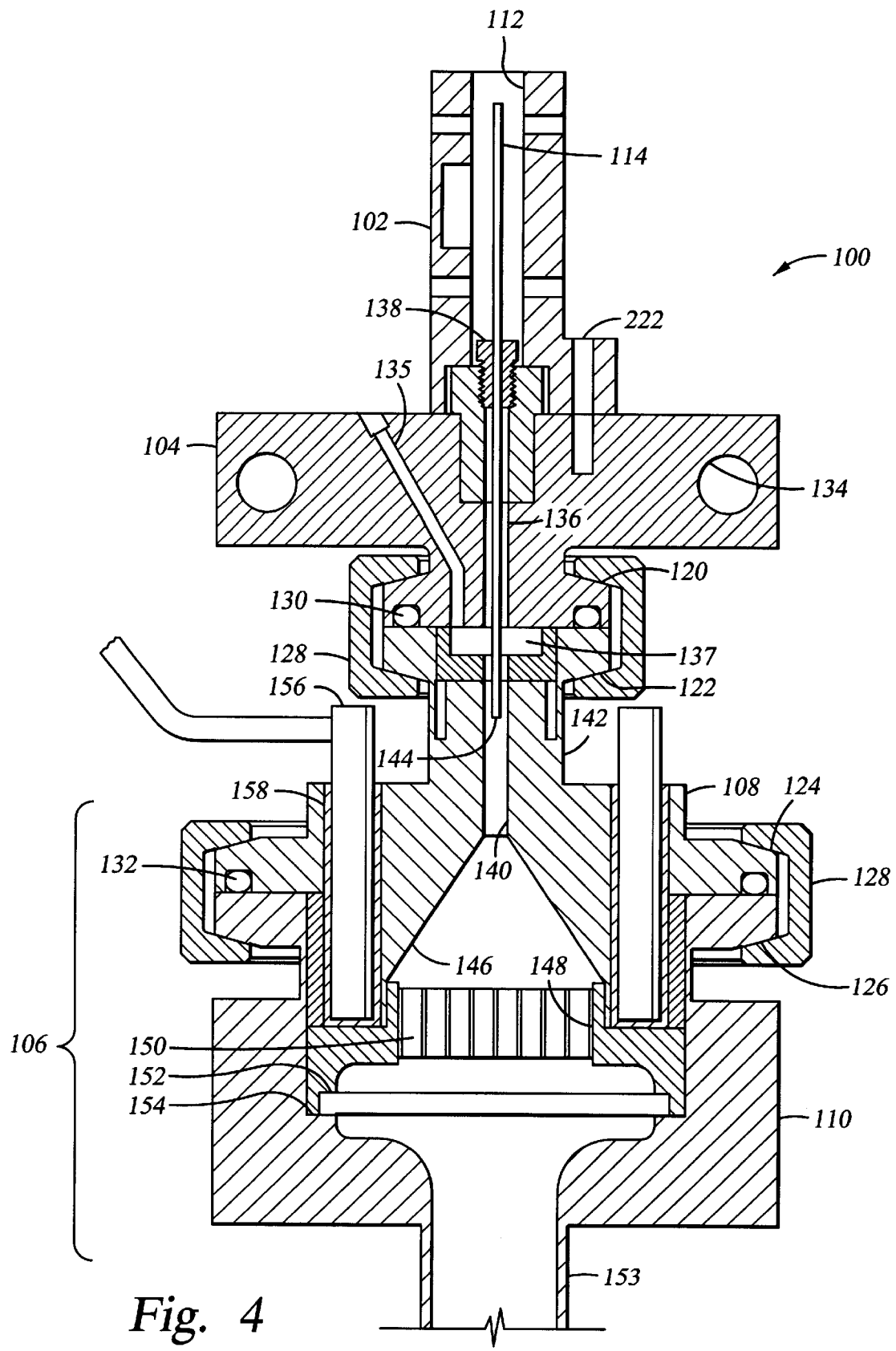
FIG. 4 is a partial schematic cross sectional view of a vaporizer of the present invention.

FIG. 4 is a cross sectional view of one embodiment of the vaporizer 100 of the present invention. The vaporizer 100 generally includes an input manifold 102, a cooling head 104, and a main body 106 comprising a top block 108 and a bottom block 110. The input manifold 102 is coupled at the upper end of the vaporizer 100 and provides an inlet 112 wherein an injection member 114, such as a capillary tube, is coaxially disposed. The injection member 114 is connected to the liquid precursor ampoule 56 (shown in FIG. 3) and the first gas container 52 (also shown in FIG. 3).

The cooling head 104 and the top block 108 are joined at abutting flanges 120 and 122 formed on the head 104 and top block 108, respectively. Similarly, the top block 108 and the bottom block 110 are joined at flanges 124 and 126 defined on the top block 108 and bottom block 110, respectively. The flanges 120, 122, 124, and 126 are adapted to receive clamps 128, such as KF clamps, to hold the various vaporizer components together during operation. O-ring seals 130 and 132 disposed in flanges 120 and 124, respectively, provide hermetic seals at the interfaces of the blocks 108, 110 and cooling head 104. O-rings 130, 132 may be any of many high temperature metal-to-metal seals such as the aluminum Delta seal from Helicoflex, for example.

One or more cooling channels 134 are preferably disposed in the head 104 in order to actively cool the O-ring seal 130 and the incoming liquid precursors. A heat exchange fluid (e.g., water, ethylene glycol, silicone oil, etc.) circulates through the channel 134 to remove heat at the O-ring seal 130. Optionally, another cooling channel (not shown) may be disposed in the main body 106 adjacent the O-ring seal 132. To maximize thermal conductivity the cooling head is preferably made of aluminum or some other thermal conductor. Although not shown in FIG. 4, a thermocouple may be disposed in a slot 222 to monitor the operating temperature at an upper end of the vaporizer 100. A dispersion/carrier, gas conduit 135 is formed in the cooling head 104 and leads to a recess 137 formed in an upper portion of the top block 108. An injection line (not shown) connects the second gas container 54 (shown in FIG. 3) to the dispersion/carrier gas conduit 135 to provide a dispersion/carrier gas thereto. The cooling head 104 provides a centrally formed inlet bore 136 wherein the injection member 114 is disposed and secured by a threaded sleeve 138. The injection member 114 is concentrically received by a gas passageway 140 extending longitudinally through a neck 142 of the top block 108 and terminating near a lower end of the neck 142. The concentric gas passageway 140, disposed about the outer perimeter of the injection member 114, may be of any geometric shape and is adapted to deliver one or more dispersion gases to a tip, or nozzle 144, of the injection member 114. Preferably, the concentric gas passageway 140 and the injection member 114 are made of PTFE for low friction coefficient and prevention of clogging.

The concentric gas passageway 140 leads to a main vaporizing section 146 which is shown as a frustoconical surface having a diametrically narrower upper end and a diametrically enlarged lower end. The main vaporizing section 146 provides a large, preferably smooth, heated surface area onto which a fluid may be deposited. A blocker 148 aligned with the lower end of the main vaporizing section 146 provides an extended vaporizing surface. The blocker 148 is preferably made of aluminum, or some other thermal conductor, and comprises a plurality of high conductance channels 150. A commercially available filter 152 such as the one available from PALL is disposed below the blocker 148 and above a high conductance outlet 153. The filter 152 is seated on an annular shoulder 154 of the bottom block 110 and is secured from above by the top block 108 thereby allowing for ease of periodic replacement by unclamping the two blocks 108, 110. The filter 152 can be any number of commercially available filters such as the one available from PALL. This arrangement provides a large conductance for shorter resonance time in the vaporizer 100 and also facilitates inspection and cleaning of the vapor flow paths.

The blocks 108 and 110, preferably made of stainless steel, provide a relatively large thermal mass for retention and transmission of thermal energy generated by one or more heating elements 156 (shown here as cartridges) surrounding the blocks 108 and 110 thereby ensuring an optimal isothermal temperature on the vaporization surfaces, as well as downstream. The heaters 156 are slidably received in receptacles 158 and may be selectively removed for maintenance and servicing. The heating elements 156 preferably deliver a total heating power of between about 1000 W and 3000 W to the blocks 108, 110 and are controlled to maintain the main body 106 at the optimum isothermal temperature by a conventional PID controller (not shown). The controller is connected to a thermocouple (also not shown) positioned within at least one, and preferably both, of the blocks 108, 110 proximate to the heated vaporizing surfaces.

All the vaporizer components are uniquely designed to facilitate disassembly, maintenance, and replacement. Each component comprises an independent unit which may be individually serviced or replaced. As shown in FIG. 4, the vaporizer 100 of the first embodiment consists of six primary components, i.e., the input manifold 102, the cooling head 104, the top block 108, the bottom block 110, the heating elements 156, the filter 152, and the blocker 148. As described above, the top block 108 and cooling head 104 are selectively coupled with a KF clamp. The top block 108 is similarly coupled to the bottom block 110. Thus, the filer 152, which must be periodically exchanged, and the blocker 148, which may require periodic cleaning, may be removed by uncoupling the top block 108 from the bottom block 110. While the blocks 108, 110 are shown coupled by KF clamps, other coupling assemblies, such as VCR® fittings may be used to advantage.

In operation, the liquid precursor is initially combined with a carrier gas, such as argon, upstream from the vaporizer 100. The mixture of liquid precursor components and the carrier gas is then delivered through the injection member 114 (preferably 2–20 mils inner diameter) to a point just above the main vaporizing section 146. The liquid and gas are supplied at a relatively high flow rate, e.g. 10 ml/min. liquid and 100–2000 sccm gas, which causes the liquid to exit the nozzle 144 and enter the main vaporizing section 146 as a jet of liquid and gas with a high nozzle velocity.

The flow meter 58 (shown in FIG. 3) can be used to control the amount of gas flowed in direct relation to the flow rate of the liquid precursor component mixture. The flow rate of the liquid is typically controlled by a flow controller such as the flow meter shown in FIG. 3. As will be understood by a person skilled in the art, the flow velocity of the liquid precursors may be independently controlled by the flow of the carrier gas input to the vaporizer 100.

One or more dispersion/carrier gases, such as argon, are delivered through the dispersion/carrier gas conduit 135 and flowed concentrically about the injection member 114 to prevent liquid droplets from forming on the nozzle 144 and moving up the outer cylinder of the injection member 114. At the level of the nozzle 144, the dispersion/carrier gas picks up the liquid precursor mixture jetting out of the injection member 114 and carries the mixture down into the main vaporizing section 146 where the liquid precursor is vaporized. To allow for optimization of this initial "flash" vaporization, the spacing between the injection member nozzle 144 and the main vaporization section 146 is preferably adjustable. Adjustment of the flash vaporization to avoid a liquid droplet "dance on the frying pan" effect is obtained by adjusting the flow rate of the gas and liquid precursor mixture. The vaporized precursors are then channeled through the plurality of high conductance channels 150 formed in the blocker 148. The blocker 148 acts as a second stage vaporizer while simultaneously collecting unvaporized liquid and directing them into the filter 152. The filter 152 enables the entrapment of any liquid which is not vaporized. This prevents liquids from passing through the vaporizer 100 and into the chamber 12 (shown in FIGS. 1, 2, and 3). The resultant deposition gas then passes through the vaporizer outlet 153 for delivery to the deposition chamber 12. The wide-mouthed outlet 153 is designed for large conductance so that precursor vapors are readily carried from the vaporizer 100 into the chamber 12.

All but a final short segment of the path of the liquid mixture is kept relatively cool (0–80° C. for BST) by a thermal choke structure comprising the cooling channel 134 and physical separation of the main body 106 from the other upstream vaporizer components by the neck. The thermal choke isolates the upper portion of the vaporizer 100 from the heat generated by heating elements 156 and prevents heat loss and generation of cold spots without inducing significant detrimental cooling effects on the other system components. In particular, the design allows the main body 106 to be maintained at an optimal isothermal temperature (e.g., 250° C.±5° for BST).

Figure 5:
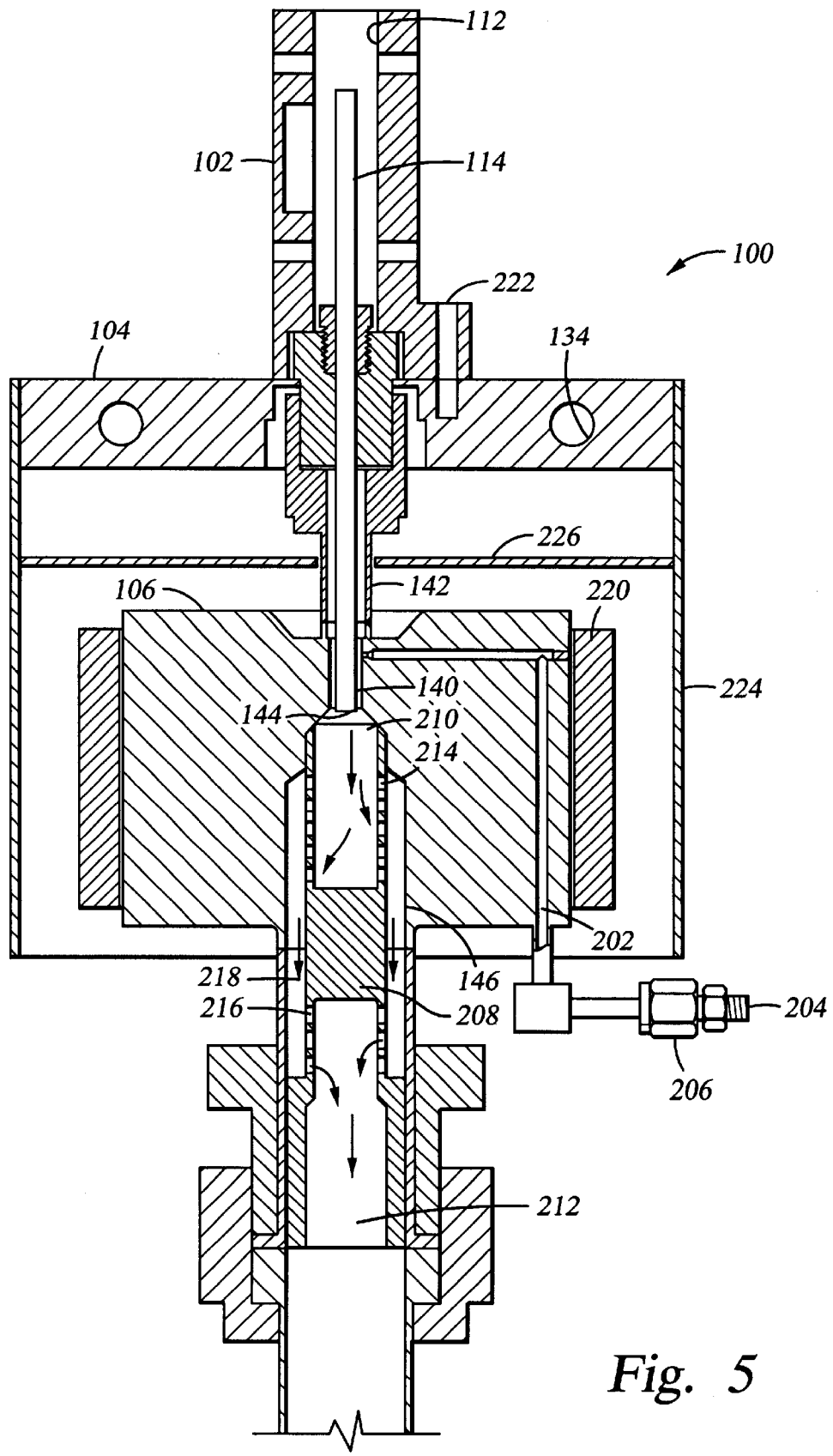
FIG. 5 is partial schematic cross sectional view of an alternative embodiment of the vaporizer.

FIG. 5 is a cross sectional view of a second embodiment of the vaporizer 100 of the present invention. The vaporizer 100 generally includes the components of the first embodiment, i.e., an input manifold 102, a cooling head 104, and a main body 106. However, the second embodiment comprises some design modifications which are discussed below.

FIG. 5 shows the dispersion/carrier gas conduit 202 formed in the main body 106. The conduit 202 extends from below the main body 106 along a perimeter portion thereof and then terminates in a passageway at the latter portion of the injection nozzle 144. An injection line 204 connected to the conduit 202 by quick disconnect fittings 206 delivers a dispersion/carrier gas to the conduit 202 from the second gas container 54 (shown in FIG. 3). The injection member 114 terminates at the entrance to a main vaporizing section 146 housing a blocker, or gas compactor 208. The gas compactor 208 is a substantially elongated cylinder having an inlet 210 at an upper end and outlet 212 at a lower end. The inlet 210 receives the nozzle 144 and comprises a plurality of exhaust ports 214 formed in the inlet wall. Similarly, the outlet 212 has a plurality of intake ports 216. The outer diameter of the gas compactor 208 is slightly less (a few millimeters) than the diameter of the main vaporizing section 146 so that a fluid channel 218 is formed leading from the exhaust ports 214 to the intake ports 216 providing communication therebetween.

The main body 106, preferably made of a monolithic piece of stainless steel, provides a relatively large thermal mass for retention and transmission of thermal energy generated by a heating jacket 220 and has a high specific heat capacity thereby ensuring an optimal isothermal temperature on the vaporization surfaces, as well as downstream. The heating jacket 220 is in the form of a C-clamp having its ends secured by a screw (shown in FIG. 3) such that it is supported on the exterior of the main body 106 and allows for easy removal of the heating jacket 220. The heating jacket 220 may be electrically heated (e.g., resistive heaters) or fluidly heated and preferably delivers a total heating power of between about 1000 W and 3000 W to the main body 106 for typical sizes and flow rates of these applications. Cartridges such as those used in FIG. 4 may also be used. The heating jacket 220 is controlled to maintain the main vaporizing section 146 at the optimum isothermal temperature by a conventional PID controller (not shown). Although not shown in FIG. 5, the vaporizer 100 of the second embodiment may also comprise a thermocouple, preferably located in the main body 106 proximate the injection member 114, to monitor the temperature during operation. An additional thermocouple (also not shown) may be received by the slot 222 located partially in the input and partially in the cooling head 104.

A thermal radiation shield 224 is shown circumferentially disposed about the midsection of the vaporizer 100. Preferably, at least the main body 106 is enclosed within the shield 224. Most preferably, the cooling head 104 is also enclosed. Preferably, the shield 224 does not directly contact the main body so that an air pocket is formed around the main body 106. The shield 224 is preferably a metal having a high thermal insulating capacity such as stainless steel. A metal membrane 226, also preferably comprised of a thermal insulator such as stainless steel, is horizontally interposed between the head 104 and the main body 106 to act as a thermal choke.

As shown in FIG. 5, the vaporizer 100 of the second embodiment consists of six primary components, i.e., the input manifold 102, the cooling head 104, the main body 106, the heating jacket 220, the gas compactor 208, and the shield 224. To allow for ease of connecting/disconnecting to one another, the components are equipped with VCR® fittings. However, other coupling devices may be used, such as the KF clamps used in the first embodiment for example.

The operation of the vaporizer 100 of the second embodiment is substantially the same as that of the first embodiment described above with a few exceptions. In the second embodiment the dispersion/carrier gas conduit 202 is shown disposed in the main body 106 at least partially adjacent the heating jacket 220. This allows the dispersion/carrier gas to be heated before its injection into the passageway. Additionally, the injection member 114 is shown in FIG. 5 extending below the neck 142 and terminating at the end of passageway 140 above the gas compactor inlet 210. This allows the liquid precursors to reach an elevated temperature due to the heat generated by the heating jacket 220 and transmitted by the main body 106. The precursors are then delivered into the inlet 210 where they are channeled through and around the gas compactor 208 as indicated by the arrows. The vaporized gas then exits the vaporizer 100 through the outlet 212 and is delivered to the deposition chamber 12 downstream.

While the number of intake ports 216 (three shown) is preferably less than the exhaust ports 214 (five shown) the total effective cross sectional area of the ports 214, 216 is substantially equal such that the volume flow rate (sccm) is substantially equal. Thus, by the equation of continuity $A_1 v_1 = A_2 v_2$, wherein $A_1$ the total cross sectional area of the exhaust ports 214, $v_1$ is the velocity of the fluid through the exhaust ports 214, $A_2$ is the total cross sectional area of the intake ports 216, and $v_2$ is the velocity of the fluid through the intake ports 216. Bernoulli's equation may then be solved for the pressure at each end of the gas compactor 208. The desired pressure is achieved by manipulating the orientation of the vaporizer 100 (to compensate for the effects of gravity), changing the length of the gas compactor 208, and altering relative size difference between the cross sectional areas of the ports 214, 216. The precise dimensions will also depend on the type of fluid used and the surface friction provided by the main vaporizing section 146 and the gas compactor 208. A slight pressure differential which biases the fluid downstream is most preferable.

As with the first embodiment all but a final short segment of the path of the liquid mixture is kept relatively cool, e.g., 0°–80° C. for BST, by a thermal choke structure comprising the cooling channel 134 and physical separation of the main body 106 from the other upstream vaporizer components. The second embodiment also employs the metal membrane 226 to reduce thermal decomposition of the liquid precursor components prior to vaporization by further inhibiting thermal conduction. Additional thermal insulation of the injection member 114 is provided by the relatively thin wall of the neck 142, e.g., a few millimeters and by the thermal insulating value of the material. The neck 142, which forms an integral part of the main body 106, is preferably made of stainless steel, PTFE, or other material having a relatively low thermal conductivity.

While certain design features are shown only with respect to the second embodiment, such as the shield 224, the heated dispersion/carrier gas conduit 202, and the heating jacket 220, these features may also be employed by the vaporizer 100 of the first embodiment. Similarly, the features of the first embodiment, such as the heating cartridges 156, may also be used to advantage in the second embodiment. Further, adjusts to elements such as the injection member 114 in either embodiment may be made without deviating from the scope of the present invention.

The vaporizer 100 of each embodiment operates to vaporize a mixture of precursor components, such as BST, and a carrier gas by providing a main vaporizer section 146 with increased surface area which exposes the mixture to a large area of evenly heated surfaces. The various components of the vaporizer 100, such as the main vaporizing section 146, the blocker 148 of the first embodiment, and the gas compactor 208 of the second embodiment each act to vigorously mix and vaporize the precursor components, carrier gases, and dispersion gases. This arrangement provides a large conductance for shorter resonance time in the vaporizer 100. The maximized surface area serves to vaporize more efficiently as well as prevent clogging.

The amount of power required for complete vaporization is a function of the chemistry of the precursor components and carrier gas, and the flow rate of the mixture. As one example, with a BST flow rate of 0.10 ml/mn and a carrier gas, e.g., Ar, flow rate of 200–300 sccm, the amount of power necessary to heat and completely vaporize the flow is approximately 10 W. In contrast to conventional arrangements, the amount of heating (e.g., vaporizing) power supplied to the mixture is set substantially higher than the level of power actually required to achieve complete vaporization. In accordance with the invention, the thermal power transferred to the vaporizer 100 is set to be one to two orders of magnitude higher than the 10 W required for complete vaporization of the mixture, i.e., between about 100 W and 1000 W, and preferably 20–30 times higher, i.e., between 200–300 W and 2000 W–3000 W. In this manner, the heating power absorbed by the flowing mixture is a small fraction of the heating power which is available. Therefore, the power absorbed by the gas vapor presents an insignificant perturbation in relation to the available heating power, making it possible to substantially maintain an ideal isothermal temperature (e.g., 250° C.±5° for BST) of the heating surfaces. In general, depending on the precursor component mixture which is used, the ideal isothermal system temperature will be in the range of about 200–300° C.

APPLICATIONS OF THE SYSTEM

Example 1

Exemplary metal-oxide layers which can be deposited using the present system may include tantalum pentoxide ($Ta_2O_5$), a zirconate titanate (ZrxTiyOz), strontium titanate ($SrTiO_3$), barium strontium titanate (BST), lead zirconate titanate (PZT), lanthanum-doped PZT, bismuth titanate ($Bi_4Ti_3O_{12}$), barium titanate ($BaTiO_3$), or the like. Other materials which can be deposited include those materials having a narrow range of vaporization between condensation and decomposition.

Example 2

While the present invention is described primarily with reference to metal oxide layers such as BST, other processes requiring the advantages of isothermal vaporization over a large conductance path may also be carried out. For example, one area of particular interest in the semiconductor industry is copper deposition.

A Cu layer may be deposited using by any known CVD Cu process or precursor gas, including copper$^{+2}$(hfac)$_2$ and Cu$^{+2}$(fod)$_2$ (fod being an abbreviation for heptafluoro dimethyl octanediene), but a preferred process uses the volatile liquid complex copper$^{+1}$hfac,TMVS (hfac being an abbreviation for the hexafluoro acetylacetonate anion and TMVS being an abbreviation for trimethylvinylsilane) with argon as the carrier gas. One such mixture (i.e., copper$^{+2}$(hfac)$_2$) is Cupra Select™ a registered trademark of Schumacher, Inc. Because this complex is a liquid under ambient conditions (i.e., >60° C.), it can be utilized in standard CVD precursor delivery systems currently used in semiconductor fabrication. TMVS and hfac are additives used to enhance adhesion, nucleation, and stability. Specifically, TMVS is a thermal stabilizer which prevents a reaction until a desired temperature is reached while hfac is a deposition controlling compound. Both TMVS and copper$^{+2}$(hfac)$_2$ are volatile byproducts of the deposition reaction that are exhausted from the chamber. The deposition reaction is believed to proceed according to the following mechanism, in which (s) denotes interaction with a surface and (g) denotes the gas phase:

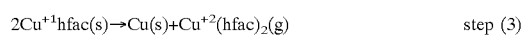

In step 1, the complex is adsorbed from the gas phase onto a metallic surface. In step 2, the coordinated olefin (TMVS in this specific case) dissociates from the complex as a free gas leaving behind $Cu^{+1}hfac$ as an unstable compound. In step 3, the $Cu^{+1}hfac$ disproportionates to yield copper metal and volatile $Cu^{+2}(hfac)_2$. The disproportionation at CVD temperatures appears to be most strongly catalyzed by metallic or electrically conducting surfaces. In an alternative reaction, the organometallic copper complex can be reduced by hydrogen to yield metallic copper.

The volatile liquid complex, $Cu^{+1}hfac$,TMVS, can be used to deposit Cu through either a thermal or plasma based process, with the thermal based process being most preferred. The substrate temperature for a plasma enhanced process is preferably between about 100 and about 400° C., while that for a thermal process is between about 50 and about 300° C., and most preferably about 170° C. The vaporizer temperature for copper deposition is preferably between 50 and 85° C. and most preferably 65° C.

While the foregoing is directed to a preferred embodiment of the invention, other and further embodiments of the invention may be devised without departing from the basic scope of thereof, and the scope thereof is determined by the claims which follow.

What is claimed:

1. An apparatus for vaporizing one or more liquids, comprising:
    a) a main body defining a main vaporizing section, the body having an inlet channel and outlet channel;
    b) a liquid injection member at least partially disposed in a passageway to deliver the one or more liquids into the main vaporizing section;
    c) a high conductance blocker disposed proximate to the main vaporizing section; and
    d) one or more heating elements in thermal communication with the main vaporizing section.

2. The apparatus of claim 1 wherein the liquid injection member is adapted to deliver one or more liquids into the main vaporizing section at a supersonic velocity at a liquid injection flow rate of less than about 10 ml/min.

3. The apparatus of claim 1 wherein the liquid injection member is attached to a liquid and gas delivery system.

4. The apparatus of claim 1 wherein a portion of the liquid injection member disposed in the passageway is adjustable.

5. The apparatus of claim 1 wherein the main body is comprised of stainless steel.

6. The apparatus of claim 1 wherein the main vaporizing section is a frustoconical surface.

7. The apparatus of claim 1 further comprising a removable filter interposed between the main vaporizing section and the outlet channel.

8. The apparatus of claim 1 further comprising a removable shield disposed about the main body.

9. The apparatus of claim 1 wherein the blocker is interposed between the main vaporizing section and the outlet channel and comprises a plurality of high conductance channels.

10. The apparatus of claim 1 wherein
    the passageway is at least partially disposed in the main body and in fluid communication with the main vaporizing section; and
    terminates in the passageway at a position above a lower end of the liquid injection member to deliver a gas thereto.

11. The apparatus of claim 1 further comprising a cooling head selectively fastened at an upper end of the body, the cooling head comprising an annular cooling channel.

12. The apparatus of claim 11 wherein
    the passageway is at least partially disposed in the main body and in fluid communication with the main vaporizing section; and
    a gas conduit is formed in the cooling head, the gas conduit terminating in the passageway at a position above a lower end of the liquid injection member to deliver a gas thereto.

13. The apparatus of claim 1 wherein the body further comprises:
    a) a top block having the main vaporizing section formed therein; and
    b) a bottom block having the outlet channel formed therein, the bottom block being selectively fastened to a lower side of the top block.

14. The apparatus of claim 13 further comprising a seal disposed between the top block and the bottom block.

15. The apparatus of claim 13 further comprising a thermal choke and a thermocouple each extending parallel to a least a part of the liquid injection member.

16. The apparatus of claim 13 wherein the top block and the bottom block are comprised of a thermal insulator.

17. The apparatus of claim 13 wherein the thermal insulator is stainless steel.

18. The apparatus of claim 13 wherein the top block and bottom block are selectively coupled together.

19. The apparatus of claim 18 wherein the top block and bottom block are selectively fastened together by clamps.

20. The apparatus of claim 18 wherein the top block and bottom block are selectively fastened together by fittings.

21. The apparatus of claim 13 further comprising a cooling head selectively fastened at an upper end of the top block, the cooling head comprising an annular cooling channel.

22. The apparatus of claim 21 wherein the top block and the bottom block are comprised of stainless steel and the cooling head is comprised of aluminum.

23. The apparatus of claim 21 further comprising a seal disposed between the cooling head and the top block.

24. The apparatus of claim 21 wherein
    the passageway is at least partially disposed in the main body and in fluid communication with the main vaporizing section; and
    a gas conduit is formed in the cooling head, the gas conduit terminating in the passageway at a position above a lower end of the liquid injection member to deliver a gas thereto.

25. An apparatus for vaporizing one or more liquids, comprising:
    a) an input manifold having an inlet channel;
    b) a cooling head detachably connected to the lower end of the input manifold and having an inlet bore in alignment with the inlet channel;
    c) a main body coupled to the lower end of the cooling head, the main body comprising:
        i) a gas passageway and main vaporizing section formed therein, the gas passageway, main vaporizing section, and the inlet channel being in fluid communication;
        ii) a high conductance removable blocker disposed proximately to the main vaporizing section; and
        iii) an outlet;
    d) one or more heating elements in thermal communication with the main vaporizing section; and
    e) an injection member disposed in the inlet channel and extending at least partially within the gas passageway.

26. The apparatus of claim 25 wherein the blocker comprises a plurality of high conductance channels.

27. The apparatus of claim 25 further comprising a removable filter disposed between the main vaporizing section and the outlet.

28. The apparatus of claim 25 wherein the one or more heating elements are detachably disposed circumferentially around the main body.

29. The apparatus of claim 25 further comprising a thermal choke disposed in the top block, the thermal choke extending parallel to at least a portion of the gas passageway.

30. The apparatus of claim 25 further comprising a liquid and gas delivery system connected to the injection member.

31. The apparatus of claim 25 wherein the height of the injection member is adjustable.

32. The apparatus of claim 25 further comprising a gas conduit disposed at least partially in the cooling head and terminating in the gas passageway at a position above the lower end of the injection member.

33. The apparatus of claim 32 wherein the gas conduit is disposed in the main body.

34. An semiconductor processing system comprising:
   a) processing chamber;
   b) a vaporizer disposed upstream from the processing chamber, the vaporizer having a cooling head detachably coupled at an upper side to an input manifold and detachably coupled at a lower side to a main body, the main body comprising:
      i) a main vaporizing section;
      ii) a gas passageway fluidly connected to the main vaporizing section;
      ii) an injection member disposed at least partially into the gas passageway;
      iii) a high conductance blocker disposed proximate to the main vaporizing section; and
      iv) an outlet channel fluidly connected to the processing chamber; and
   c) a liquid delivery system connected to the gas passageway.

35. The system of claim 34 further comprising a removable filter disposed between the main vaporizing section and the outlet.

36. The system of claim 34 wherein a portion of the injection member extends through the input manifold and the cooling head.

37. The system of claim 34 wherein the height of the injection member is adjustable.

38. The system of claim 34 further comprising a gas conduit formed in the cooling head and terminating in the gas passageway at a point above the lower end of the injection member.

39. The system of claim 38 wherein the gas conduit is formed in the main body.

40. The system of claim 34 further comprising a thermal radiation shield disposed circumferentially about the main body.

41. An apparatus for vaporizing one or more liquids, comprising:
   a) a main body defining a main vaporizing section, the body having an inlet channel and an outlet channel;
   b) a liquid injection member to deliver the one or more liquids into the main vaporizing section;
   c) a high conductance blocker disposed proximate to the main vaporizing section; wherein the blocker comprises a gas compactor at least partially disposed within the main vaporizer section, the gas compactor comprising:
      1) an inlet having a first plurality of ports formed therein; and
      2) an outlet having a second plurality of ports formed therein; and
   d) one or more heating elements in thermal communication with the main vaporizing section.

42. The apparatus of claim 41 further comprising a gas channel defined by the main vaporizing section and the gas compactor providing fluid communication between the first plurality of ports and the second plurality of ports.

43. An apparatus for vaporizing one or more liquids, comprising:
   a) a main body defining a main vaporizing section, the body having an inlet channel and an outlet channel;
   b) a liquid injection member to deliver the one or more liquids into the main vaporizing section;
   c) a cooling head selectively fastened at an upper end of the body;
   d) a high conductance blocker disposed proximate to the main vaporizing section; and
   e) one or more heating elements in thermal communication with the main vaporizing section.

44. The apparatus of claim 43 wherein the cooling head comprises an annular cooling channel.

45. The apparatus of claim 43 further comprising:
   a) a passageway disposed in the main body wherein at least a portion of the liquid injection member is disposed and wherein the passageway is in fluid communication with the main vaporizing section; and
   b) a gas conduit formed in the cooling head, the gas conduit terminating in the passageway at a position above a lower end of the injection member to deliver a gas thereto.

46. The apparatus of claim 43 wherein the body further comprises:
   a) a top block having the main vaporizing section formed therein; and
   b) a bottom block having the outlet channel formed therein, the bottom block being selectively fastened to a lower side of the top block.

47. The apparatus of claim 46 further comprising a seal disposed between the top block and the bottom block.

48. The apparatus of claim 46 further comprising a thermal choke and a thermocouple each extending parallel to a least a part of the liquid injection member.

49. The apparatus of claim 46 wherein the top block and the bottom block are comprised of a thermal insulator.

50. The apparatus of claim 46, wherein the cooling head comprises an annular cooling channel.

51. The apparatus of claim 50 further comprising:
   a) a passageway disposed in the top block wherein at least a portion of the liquid injection member is disposed and wherein the gas passageway is in fluid communication with the main vaporizing section; and
   b) a gas conduit formed in the cooling head, the gas conduit terminating in the passageway at a position above a lower end of the injection member to deliver a gas thereto.

52. An apparatus for vaporizing one or more liquids, comprising:
   a) an input manifold having an inlet channel;
   b) a cooling head detachably connected to the lower end of the input manifold and having an inlet bore in alignment with the inlet channel;
   c) a main body coupled to the lower end of the cooling head, the main body comprising:
      i) a gas passageway and main vaporizing section formed therein, the gas passageway, main vaporizing section, and the inlet being in fluid communication;
      ii) a high conductance removable blocker disposed proximately to the main vaporizing section; wherein the blocker comprises a gas compactor at least partially disposed within the main vaporizing section, the gas compactor comprising:
         a) an inlet having a first plurality of ports formed therein; and
         b) an outlet having a second plurality of ports formed therein; and
      iii) an outlet; and
   d) one or more heating elements in thermal communication with the main vaporizing section.

53. The apparatus of claim 52 further comprising a gas channel defined between the main vaporizing section and the gas compactor providing fluid communication between the first plurality of ports and the second plurality of ports.

54. An semiconductor processing system comprising:
   a) processing chamber;
   b) a vaporizer disposed upstream from the processing chamber, the vaporizer having a cooling head detachably coupled at an upper side to an input manifold and detachably coupled at a lower side to a main body, the main body comprising:
      i) a main vaporizing section;
      ii) a gas passageway fluidly connected to the main vaporizing section;
      ii) an injection member disposed at least partially into the gas passageway;
      iii) a high conductance blocker interposed between the main vaporizing section and the outlet channel and comprises a plurality of high conductance channels; and
      iv) an outlet channel fluidly connected to the processing chamber; and
   c) a liquid delivery system connected to the gas passageway.

55. The apparatus of claim 54 wherein the blocker comprises a gas compactor at least partially disposed within the main vaporizing section, the gas compactor comprising:
   a) an inlet having a first plurality of ports formed therein; and
   b) an outlet having a second plurality of ports formed therein.

56. The apparatus of claim 54 further comprising a gas channel defined between the main vaporizing section and the gas compactor providing fluid communication between the first plurality of ports and the second plurality of ports.

* * * * *

UNITED STATES PATENT AND TRADEMARK OFFICE
CERTIFICATE OF CORRECTION

PATENT NO. : 6,210,485 B1
DATED : April 3, 2001
INVENTOR(S) : Jun Zhao, Lee Luo, Xiaoliang Jin, Frank Chang, Charles Dornfest and Po Tang It is certified that error appears in the above-identified patent and that said Letters Patent is hereby corrected as shown below:

<u>Title page,</u>
*Attorney, Agent, or Firm* name, please replace "Patterso" with -- Patterson --

<u>Column 1,</u>
Line 61, please insert a double quotation mark after "Reactor,".

<u>Column 3,</u>
Line 25, please replace "a outlet" with -- an outlet --.

<u>Column 6,</u>
Line 48, please replace "filer" with -- filter --.

<u>Column 11,</u>
Line 62, please insert "a gas conduit" before "terminates".

<u>Column 14,</u>
Line 53, please replace "a least" with -- at least --

<u>Column 15,</u>
Line 26, please replace "between" with -- by --.
Line 29, please replace "an" with -- a --.

<u>Column 16,</u>
Line 28, please replace "between" with -- by --.

Signed and Sealed this

Fifth Day of November, 2002

*Attest:*

JAMES E. ROGAN
*Attesting Officer*  *Director of the United States Patent and Trademark Office*